United States Patent
Bryant

[11] Patent Number: 5,972,776
[45] Date of Patent: Oct. 26, 1999

[54] METHOD OF FORMING A PLANAR ISOLATION STRUCTURE IN AN INTEGRATED CIRCUIT

[75] Inventor: Frank Randolph Bryant, Denton, Tex.

[73] Assignee: STMicroelectronics, Inc., Carrollton, Tex.

[21] Appl. No.: 08/576,955

[22] Filed: Dec. 22, 1995

[51] Int. Cl.⁶ .................................................. H01L 21/762
[52] U.S. Cl. ........................................... 438/440; 438/445
[58] Field of Search ...................... 437/72; 148/DIG. 85, 148/DIG. 86; 438/445, 440, FOR 229

[56] References Cited

U.S. PATENT DOCUMENTS

| | | |
|---|---|---|
| 4,026,740 | 5/1977 | Owen, III . |
| 4,160,987 | 7/1979 | Dennard et al. . |
| 4,266,985 | 5/1981 | Ito et al. . |
| 4,407,696 | 10/1983 | Han et al. . |
| 4,508,757 | 4/1985 | Fabricius et al. . |
| 4,551,910 | 11/1985 | Patterson . |
| 4,553,314 | 11/1985 | Chan et al. . |
| 4,637,128 | 1/1987 | Mizutani . |
| 4,755,477 | 7/1988 | Chao . |
| 4,986,879 | 1/1991 | Lee . |
| 5,151,381 | 9/1992 | Liu et al. . |
| 5,192,707 | 3/1993 | Hodges et al. . |
| 5,210,056 | 5/1993 | Pong et al. .............................. 437/239 |
| 5,258,333 | 11/1993 | Shappir et al. ......................... 437/235 |
| 5,260,229 | 11/1993 | Hodges et al. ............................. 437/69 |
| 5,264,724 | 11/1993 | Brown et al. ............................ 257/347 |
| 5,286,672 | 2/1994 | Hodges et al. ............................. 437/70 |
| 5,296,411 | 3/1994 | Gardner et al. ......................... 437/238 |
| 5,310,692 | 5/1994 | Chan et al. ................................ 437/41 |
| 5,397,732 | 3/1995 | Chen ......................................... 437/69 |
| 5,432,118 | 7/1995 | Orlowski et al. . |
| 5,512,509 | 4/1996 | Han ........................................ 437/72 |

FOREIGN PATENT DOCUMENTS

| | | |
|---|---|---|
| 56-38844 | 4/1981 | Japan . |
| 58-40839 | 3/1983 | Japan . |
| 58-90778 | 5/1983 | Japan . |
| 59-65445 | 4/1984 | Japan . |
| 59-188938 | 10/1984 | Japan . |
| 63-141346 | 6/1988 | Japan . |
| 63-293850 | 11/1988 | Japan . |
| 63-300526 | 12/1988 | Japan . |
| 1-14926(A) | 1/1989 | Japan . |
| 1-205553 | 8/1989 | Japan . |
| 2-10836 | 1/1990 | Japan . |
| 4-234145 | 8/1992 | Japan . |
| 59-161837 | 9/1994 | Japan . |
| 6-252257 | 9/1994 | Japan . |
| 2101399 | 1/1983 | United Kingdom . |

OTHER PUBLICATIONS

Irene, et al., "Residual Stress, Chemical Etch Rate, Refractive Index, and Density Measuremenets on SiO, Films Prepared Using High Pressure Oxygen", pp. 396–399, J. Electrochem. Soc., Feb. 1980.

VIB–1, "integration of Poly Buffered LOCOS and Gate Processing for Submicrometer Isolation Technique", Juengling, et al., IEEE Transactions on Electron Devices, V. 38. No. 12, Dec. 1991, p. 2721.

(List continued on next page.)

*Primary Examiner*—George Fourson
*Attorney, Agent, or Firm*—Theodore E. Galanthay; Lisa K. Jorgenson; Dan Venglarik

[57] ABSTRACT

A method is provided for forming isolated regions of oxide of an integrate circuit, and an integrated circuit formed according to the same. A plurality of active areas is formed in an upper surface of a portion of a substrate body. A field oxide region is formed which separates at least two of the plurality of the active areas, wherein an upper surface of the field oxide region is substantially planar with an upper surface of the substrate body. Nitride spots are formed in the bulk of the field oxide region and not in the active area which do not need to be removed since they do not effect device integrity.

25 Claims, 4 Drawing Sheets

OTHER PUBLICATIONS

Kangar, et al., "An Integrated Isolation/Gate Process for Sub–Quarter Micron Technologies", pp. 141–142, May 1993 Symposium on VLSI Technology.

Josquin, et al., "The Oxidate Inhibition in Nitrogen–. . . Silicon", pp. 1803–1810, V. 129, No. 8, Aug. 1982, J. Electrochem. Soc.

Sung, et al., "Reverse L–Shape Sealed Poly–Buffer LOCOS Technology", IEEE Electron Device Letters, vol. 11, No. 11, Nov. 1990, pp. 549–551.

Eklund, et al., A 0.5–$\mu$ BiCMOS Technology for Logic and 4Mbit–class SRAM's, pp. 425–428, 1989 IEEE.

Minegishik, "A New Framed Mask Method for Selective Oxidation", Jap. J. Appl. Phys., vol. 20 (1981) Supplement 20–1, pp. 55–61.

S. Marshall, et al., "Dry Pressure Local Oxidation of Silicon for IC Isolation", Journal of the Electrochemical Society, V. 122, No. 10, Oct. 1975.

R. Zeto, et al., "Low Temperature Thermal Oxidation of Silicon by Dry Oxygen Pressure above 1 Atm", The Electrochemical Society, V. 122, No. 10, Oct. 1975.

Lin, et al., "Twin–White–Ribbon Effect and Pit Formation Mechanism in PBLOCOS", J. Electrochem. Soc., V. 138, No. 7, Jul. 1991, pp. 2145–2149.

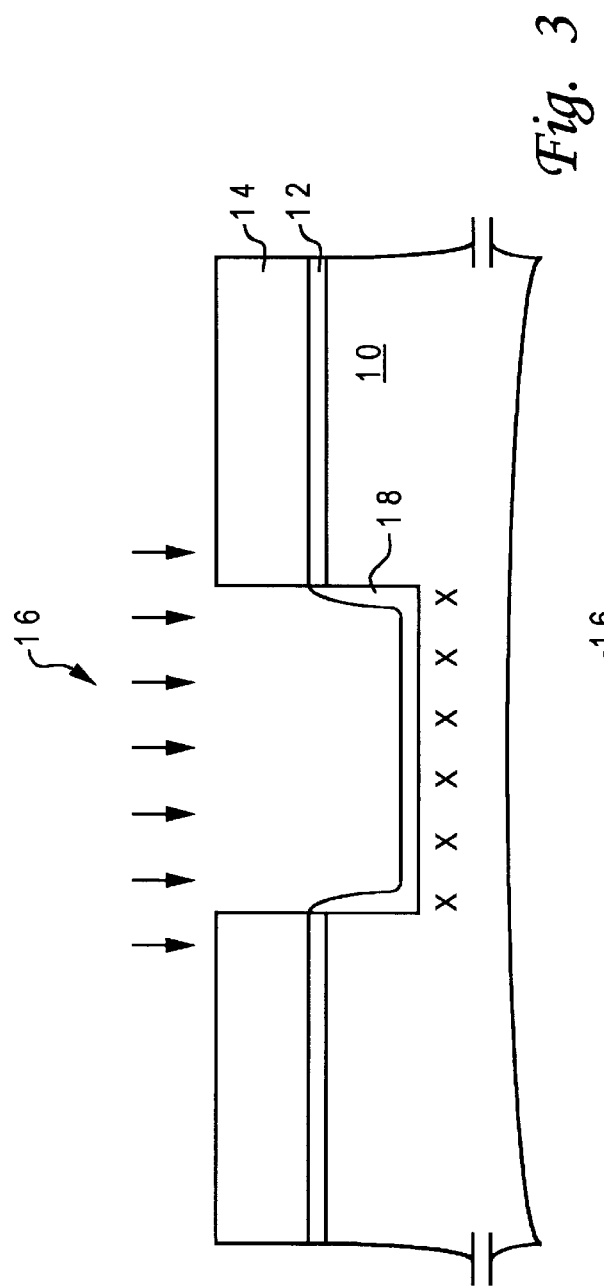
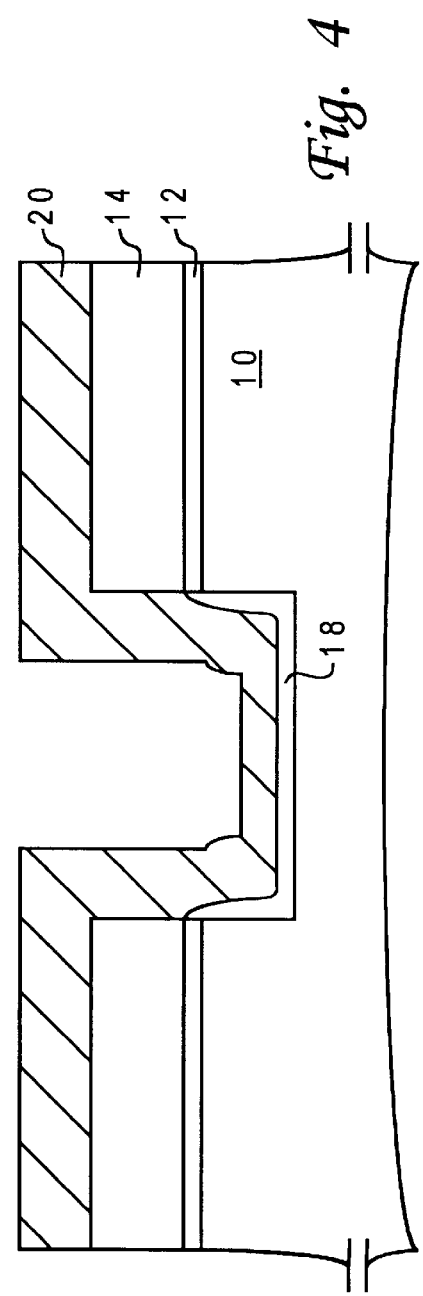

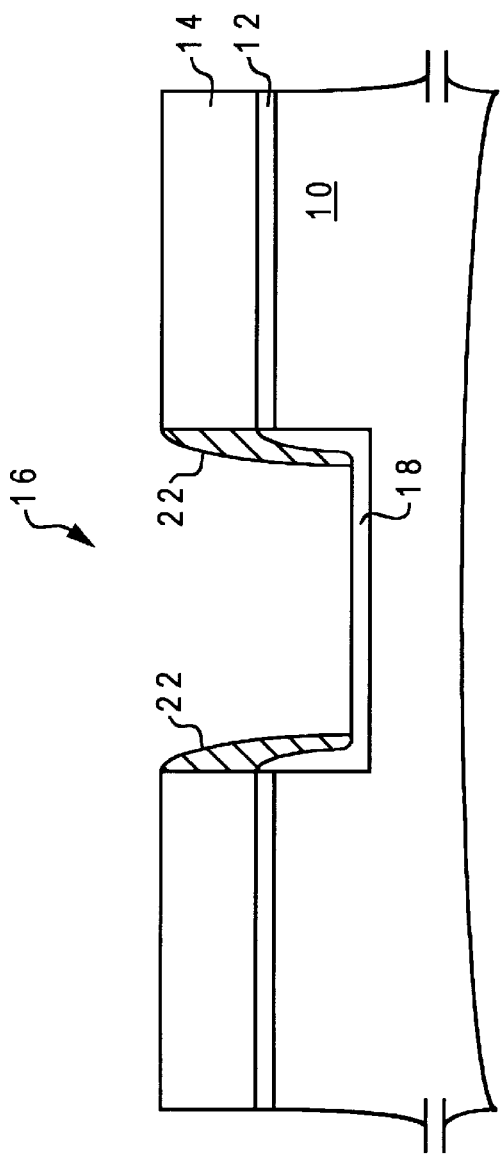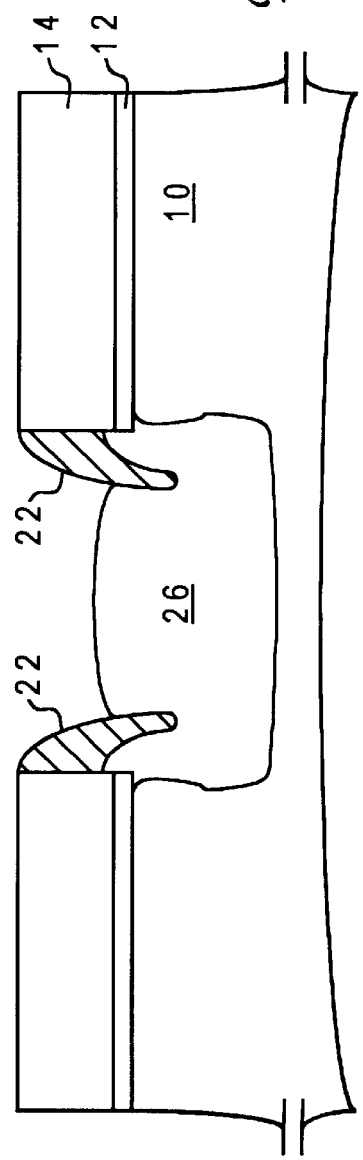

METHOD OF FORMING A PLANAR ISOLATION STRUCTURE IN AN INTEGRATED CIRCUIT

FIELD OF THE INVENTION

The present invention relates generally to semiconductor integrated circuit processing, and more specifically 1to an improved method of forming a planar isolation structure in an integrated circuit.

BACKGROUND OF THE INVENTION

The trend to continue to miniaturize semiconductor integrated circuits to achieve submicron feature sizes and increase the number of devices fabricated on the integrated circuit has required smaller isolation areas between devices. The active areas in which devices are built are isolated by a layer of oxide known as field oxide. However, the technology used to isolate active areas has not kept pace with the everdecreasing device geometries.

Isolation techniques should meet a variety of requirements. First, active areas should be in close proximity. Second, the lateral encroachment or tapering of the field oxide into the active areas, known as "birdbeaking", should be minimized. Third, the leakage current between active devices should be negligible. Fourth, the process for forming the field oxide regions must be easily adapted for use with standard integrated circuit fabrication process flows and not adversely affect device parameters.

Many methods have been proposed over the years to reduce the bird's beak of a field oxide region when isolating devices. One such method of isolating devices, LOCOS, local oxidation of silicon, produces regions of insulating silicon dioxide between devices. The LOCOS process was a great technological improvement in reducing the area needed for the isolation regions and decreasing some parasitic capacitances.

In LOCOS, silicon nitride is deposited and patterned over a stress relief pad oxide layer. The silicon nitride layer is retained over the area over where further oxidation is not desired. Thus, the silicon nitride is etched to expose a portion of the pad oxide where the field oxide is to be grown. After the thermal oxidation of the exposed pad oxide to form the field oxide regions, the silicon nitride layer is removed.

Several problems occurred, however, with LOCOS. Thermal oxidation in the original LOCOS form always incurred lateral encroachment, or birdbeaking, of the field oxide into the active areas growing under the silicon nitride mask. This birdbeaking is a substantial sacrifice of active areas that becomes significant for feature sizes less than 1.5 microns. The active area becomes smaller than the initial dimensions of the nitride layer.

Attempts to suppress birdbeaking in LOCOS, such as forming thicker nitride layers, caused stress-related defects in the nearby substrate due to the difference in the thermal coefficients of expansion between the silicon substrate and the silicon nitride layers. Process complexity also increased substantially in attempting to avoid these stress-related defects. To achieve submicron geometries, there can be little or no physical loss of the active areas as occurs with the birdbeaking phenomenon.

To reduce the bird's beak effect, there has been proposed the use of a polysilicon layer between the nitride layer and the pad oxide layer as more fully described in U.S. Pat. No. 4,407,696, issued Oct. 4, 1983 to Han et al. The use of the polysilicon layer in the LOCOS process, known as poly-buffered LOCOS or PBLOCOS, is used to reduce oxidation induced stacking faults resulting from the stress caused by the different thermal coefficients of expansion between the silicon substrate and a thick silicon nitride layer overlying the substrate. As described more fully in the publication "Twin-White-Ribbon Effect and Pit Formation Mechanism in PBLOCOS", J. Electrochem. Soc., Vol 138, No. Jul. 7, 1991 by Tin-hwang Lin et al, the polysilicon layer absorbs the excessive stress caused by the silicon nitride and prevents the lateral encroachment of oxidants, thus reducing the bird's beak.

The field oxide layer grown using poly-buffered LOCOS thus comprises the oxide derived from the silicon substrate, a portion of the pad oxide layer and oxide derived from the polysilicon layer. Afterwards, the nitride layer, the polysilicon layer and the pad oxide are etched. The poly-buffered LOCOS process reduces the bird's beak area over standard LOCOS resulting in less encroachment of the tapered portion of the field oxide into the active areas under the nitride mask. However, the bird's beak effect still remains, due to the oxidation of the polysilicon layer. In addition, the complexity of the process increases substantially in order to achieve the resulting structure.

In order to further decrease the bird's beak area using poly-buffered LOCOS, it has been proposed to surround the polysilicon layer with silicon nitride, as more fully described in U.S. Pat. No. 4,260,229, issued Nov. 9, 1993 to Hodges et al. and incorporated herein. As with standard poly-buffered LOCOS, the stress caused between the thick nitride layer over a thin pad oxide and the silicon substrate is reduced by the addition of the polysilicon layer. The bird's beak is further reduced due to the encapsulation of the polysilicon in silicon nitride. The oxidation of the polysilicon is reduced or eliminated. None of the polysilicon layer thus forms any part of the thermally grown field oxide. The resulting bird's beak is thus substantially reduced. Also in an effort to decrease the bird's beak, it has also been proposed to use a nitrogen implant into the polysilicon layer followed by an annealing step to encapsulate the polysilicon layer in silicon nitride, as more fully described in U.S. Pat. No. 5,192,707, issued on Mar. 9, 1993 to Hodges, et al. None of the polysilicon layer should thus form any part of the thermally grown field oxide. The resulting bird's beak area under the nitride mask is thus substantially reduced.

Each of these ideas help to reduce the bird's beak at the edge of field oxides but thick field oxides add to the topography of the surface of the wafer. Global planar isolation surfaces are desirable for submicron design rule technologies, particularly under 0.5 microns. Transistor gate patterns are subject to reflective notching problems from the topographies created by thick field oxide isolation regions. Anti-Reflective coatings and increased die loading in photoresists are designed to decrease the reflective notching problems, but inherently add to process complexity and cost, decreased pattern quality and increased exposure times. Some planarizing isolation processes are often times very expensive, such as Chemical Mechanical Polishing (CMP). Other planarizing techniques create high defectivities such as the well-known techniques: buried-oxide isolation technology (BOX) and recessed sealed-interface local oxidation technology (SILO and POP-SILO). Yet other techniques are very complex such as the nitride encapsulated polybuffered LOCOS process (NEPBL). Finally, other techniques simply do not work as well such as trench isolation, and spin-on-glass fills with etchback processes. It would be desirable to have a process of forming a field oxide region with a reduced bird's beak which also forms a substantially planar surface.

It is therefore an object of the present invention to provide a method of forming an isolation region with a reduced bird's beak.

It is a further object of the present invention to provide such a method which provides more planarization for subsequent processing steps which will improve step coverage of subsequently formed layers.

It is yet a further object of the present invention which utilizes standard integrated circuit processing steps.

Other objects and advantages of the present invention will be apparent to those of ordinary skill in the art having reference to the following specification together with the drawings.

SUMMARY OF THE INVENTION

The invention may be incorporated into a method for forming a semiconductor device structure, and the semiconductor device structure formed thereby. A first oxide layer is formed over a portion of a substrate and a first nitride layer is formed over the first oxide layer. The first oxide and nitride layers are patterned and etched to form an opening exposing a portion of the substrate where a field oxide will be grown. The substrate is etched in the opening, and may be oxidized to form a thin second layer of oxide in the opening along the horizontal and vertical sidewalls of the substrate in the opening. A second nitride layer is formed over the first nitride layer and in the opening over the exposed substrate, or second oxide layer, if formed. The second nitride layer is etched to form a nitride sidewall spacer in the opening. The field oxide region is grown having an upper surface substantially planar with the upper surface of the substrate and with lateral growth minimized, relative to the original pattern, due to the presence of the nitride sidewall spacer. The first nitride layer, first oxide layer and nitride sidewall spacer are etched leaving a nitride spot in the bulk of the field oxide region.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

FIGS. 1–7 are cross-sectional views of the fabrication of a semiconductor integrated circuit according to an embodiment of the present invention.

DETAILED DESCRIPTION OF THE PREFERRED EMBODIMENTS

Referring now to FIGS. 1–7, a method of fabricating an integrated circuit to have a planar isolation structure according to an embodiment of the present invention will now be described in detail. The cross-sections of FIGS. 1–7 illustrate this method as a portion of an overall process flow for fabricating the integrated circuit. As will be apparent to those of ordinary skill in the art, the partial process flow to be described herein may be applied in the fabrication of many types of integrated circuits, in which the full process flow will include many other process steps conventional in the art.

Figure 1:
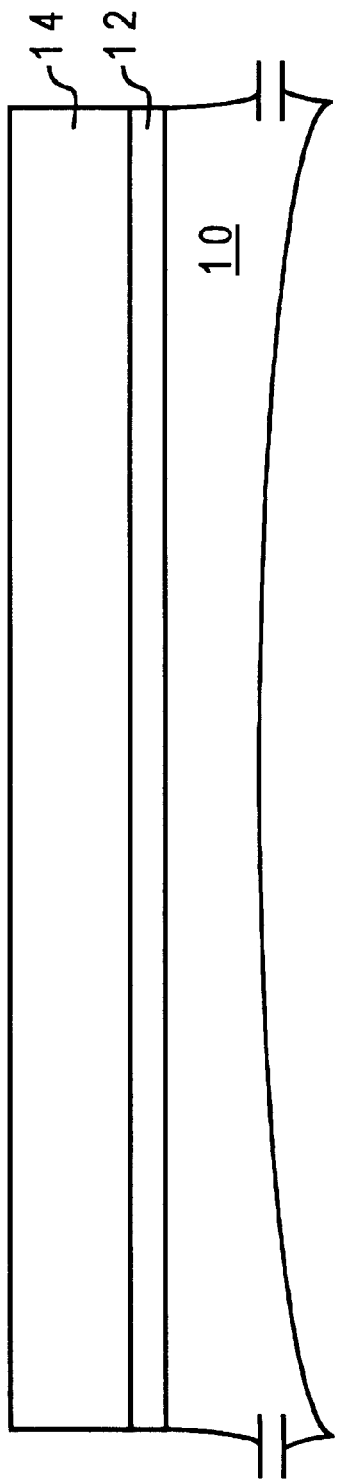

Referring to FIG. 1, an integrated circuit is to be formed on a body of silicon substrate 10. A stress relief pad oxide layer 12 is deposited or grown on the substrate 10. The pad oxide layer 12 is typically formed by thermal oxidation at a temperature of approximately 700 to 1000 degrees C. for several minutes to 2 hours which will grow the oxide to a thickness of between approximately 5 to 200 angstroms, more preferably 40 angstroms. A first nitride layer 14 comprising silicon nitride ($Si_3N_4$) is formed over the oxide layer 12. Layer 14 will typically have a thickness of between approximately 50 to 1000 angstroms, more preferably 400 angstroms. Layer 14 may be formed by chemical vapor deposition as is known in the art or by rapid thermal nitridation (RTN) of the oxide layer 12, although RTN may be difficult to control for submicron geometries. RTN of the oxide layer will result in a smaller pad oxide layer 12 under the first silicon nitride layer 14.

Figure 2:
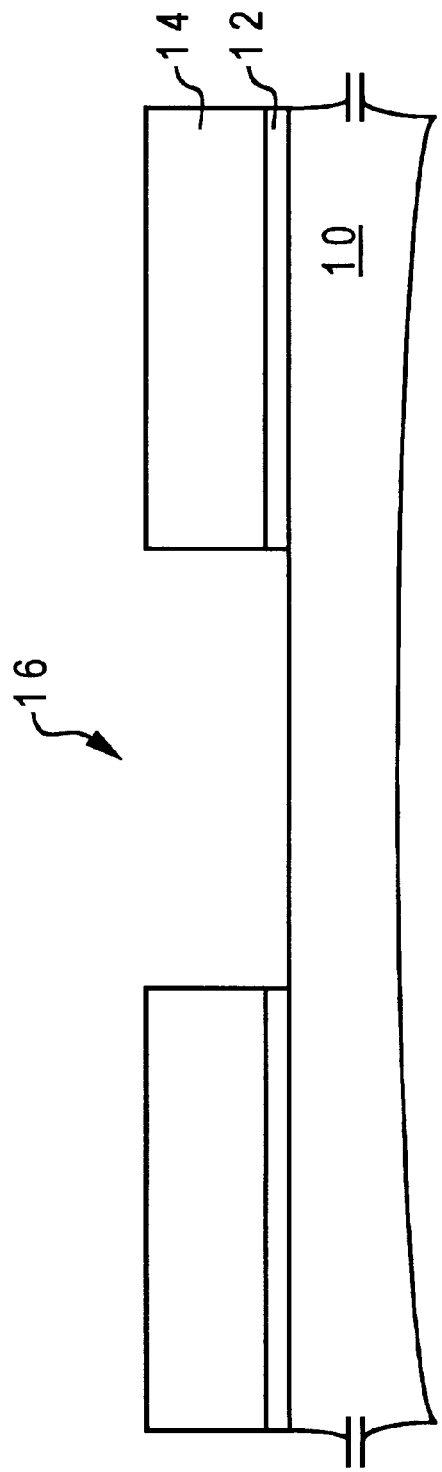

Referring to FIG. 2, a photoresist layer (not shown) is formed over the first nitride layer 14 and patterned. The oxide layer 12 and nitride layer 14 are then etched to form an opening 16 to define an area in which the isolation or field oxide region is to be manufactured. The opening 16 or location where the isolation structure is to be formed may be within a single doped region, such as an n- or p-will or may be at boundaries between doped regions of opposite conductivity type, such as between n-and p-wells. The substrate areas which remain covered by the oxide 12 and nitride 14 will have active devices formed therein separated by the isolation or field oxide regions to be formed in opening 16.

Referring to FIG. 3, the substrate 10 is anisotropically etched to a depth of between approximately 200 to 5000 angstroms, more preferably 1000 angstroms. This etch will allow the subsequent formation of the field oxide in opening 16 to form a more planar surface with the original substrate surface or devices which will be formed adjacent to the field oxide region. At this stage, a channel stop implant made be made into the silicon substrate 10. If an implant is done, as represented by the arrows, the ions will have sufficient energy to penetrate into the silicon substrate 10 but will not have sufficient energy to penetrate the first nitride layer 14 and oxide layer 12, thus the implant will occur only into the substrate 10 through opening 16 as represented by the Xs.

The substrate is preferably oxidized at this stage to form a thin layer of oxide 18 in the bottom of the opening 16. The oxide is grown to a thickness on the order of approximately 5–200 angstroms, more preferably 5–30 angstroms. Growth of only 5 angstroms does not necessarily need to be actively done, for example, 5 angstroms could naturally occur in the atmosphere or by chemical passivation. The benefit of this oxide layer will become more apparent with reference below to both the formation of a nitride spacer and a field oxide region.

Referring to FIG. 4, a second silicon nitride layer 20 is formed over the first silicon nitride layer 14 extending into opening 16 over the exposed substrate, again preferably by chemical vapor deposition. Silicon nitride layer 20 will have a thickness on the order of approximately 20 to 1000 angstroms, more preferably 200 to 400 angstroms.

Referring to FIG. 5, the second silicon nitrice layer 20 is anisotropically etched in opening 16 to form a silicon nitride sidewall 22 along the edges of oxide layer 12 and first silicon nitride layer 14 in opening 16. The nitride sidewalls 22 will also form along the edge of the thin oxide layer 18 in opening 16 if formed, otherwise, the sidewall will be formed along the vertical wall of the substrate in the opening. If the nitride layer had been deposited directly on the substrate, the nitride etch would tend to damage the substrate surface. Thus, the thin oxide layer 18 disposed between the nitride layer 20 and the substrate will act as an etch stop during the nitride etch and will protect both the vertical and horizontal surfaces of the substrate 10 in the opening.

Referring to FIG. 6, a field oxide region 26 is thermally grown in opening 16. Field oxide 26 is grown by methods known in the art such as wet oxidation at temperatures of around 1000° C. for ½ to 2 hours. The overall thickness of the resulting field oxide, which includes a portion of the silicon substrate 10 and the oxide layer 18, if formed, will be between approximately 500 to 5000 angstroms, more preferably 4000 angstroms. The thickness of the grown field oxide will depend upon the starting depth of the etched substrate in the opening below the original substrate surface and the desired final thickness of the field oxide. The final thickness of the field oxide may be less than the as grown field oxide. For example, some amount of field oxide may be etched away during subsequent steps such as growing and removing the strip gate oxide. In other words, the final field oxide will have a thickness such that an upper surface of the field oxide will be approximately at or substantially planar with an upper surface of the original substrate surface. For example, if the substrate is etched wherein the substrate surface in the opening is approximately 1000 angstroms below the original substrate surface, then the thickness of the grown field oxide may be 2000 to 4000 angstroms in order that the upper surface of the field oxide is approximately at or substantially planar with the upper surface of the original substrate surface. Since the field oxide was grown from an etched substrate at a lower starting location than the original substrate surface, the isolation distance between the active areas and devices is increased due to the additional length trenched in the substrate.

In the prior art, the oxide grows where there is no masking nitride such as that found at the edges of the exposed substrate where active devices are to be formed. Some oxidation will occur in a lateral direction causing the oxide to grow under the pad oxide and lift the nitride edges, thus forming a bird's beak.

However, in the present invention in which the substrate has been etched below its original surface before the thermal oxidation step, the growth of the field oxide begins below the nitride sidewall spacer and tends to grow more vertically than laterally relative to the original pattern. In this case, the nitride sidewall spacer will minimize the lateral oxidation of the vertical sidewalls of the silicon substrate to help reduce the bird's beak at the edge of the field oxide. The field oxide will, however, laterally extend to some distance under the pad oxide layer 12, particularly if the thin oxide layer 18 is formed. Therefore, the thin oxide layer 18 must be thick enough to protect the substrate but thin enough so that it does not substantially enhance the lateral oxidation of the silicon. If the oxide layer 18 is too thick, it will not only promote lateral oxidation, but it may allow the nitride sidewall to peel away during field oxide growth, thus, eliminating the benefits of the nitride sidewall. With the growth of the field oxide region surrounding the nitride sidewall spacer, the bird's beak of the field oxide region should be decreased.

To promote the vertical growth of the field oxide over the lateral growth, an alternative embodiment is described. Oxygen may implanted into the substrate in the bottom of opening 16, either before the second nitride layer 20 is formed, as in FIGS. 3 and 4, or after the nitride sidewall spacers 22 are formed, preferably after the sidewall spacers. The growth of the field oxide will be enhanced near the oxygen implant which is in the substrate at the bottom of the opening, thus the vertical growth of the field oxide will be enhanced but not the lateral growth of the field oxide.

Figure 7:
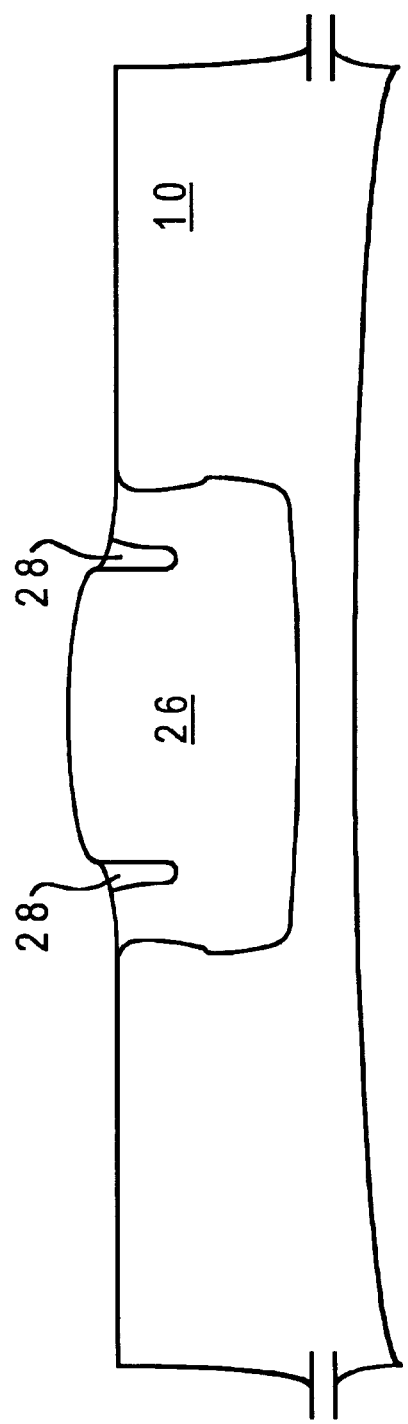

Referring to FIG. 7, the oxide layer 12 and nitride layer 14 as well as the nitride sidewall spacers 22 remaining on the surface of the field oxide region 26 are etched away. Nitride spots 28 in the bulk of the field oxide region remain. This etch may be a timed etch so that the nitride below the upper surface of the grown field oxide is not etched away preventing the formation of a void in the bulk of the field oxide region. If the nitride spacer is very thin, even with a timed etch, it may be removed leaving a void 28 instead of a nitride spot. 28 in the field oxide where the nitride was removed. If this occurs, there may be some lateral oxidation of the void during the strip gate formation. After removal of the strip gate, an oxide seam would be left closing the void in the field oxide. As with the field oxide region, the nitride spots, even if exposed at the surface of the field oxide region, will also act as a good insulator between active areas. Thus, these nitride spots do not need to be removed before subsequent processing can take place.

In the prior art, a thin nitride layer forms in the active area along the interface between the pad oxide and the silicon substrate during the thermal oxidation step. This nitride layer is known to negatively impact device performance of subsequently formed devices in this area typically due to the thinning of subsequent layers over this nitride layer. This nitride layer is generally removed with a known sacrificial gate oxide layer before subsequent steps are carried out to maintain the integrity of such devices as field effect transistors. However, as more fully described in U.S. patent application Ser. No. 08/172,636, Attorney's Docket No. 92-C-079, if the nitride layer is formed in a manner which does not effect the integrity of the subsequently formed devices, the nitride layer does not need to be removed.

In the present invention, the nitride spots 28, formed as a result of the etch of the nitride sidewalls 22, these nitride spots are internal to the bulk of the field oxide region 26, not in an active area. Thus, these spots do not need to be removed, again even if the spots are exposed at the surface of the field oxide region 26. If any nitride additionally forms in the active area as a result of the Kooi effect, it may be stripped away as with the prior art with a sacrificial gate oxide layer as is known in the art.

In the present invention, the bird's beak is reduced since the lateral growth of the field oxide is reduced. Minimization of the lateral growth is important to reduce the lateral stress which causes crystal defects in the substrate. Additionally, the field oxide can be grown to the desired thickness while at the same time achieving more planarity with the upper surface of the substrate and adjacent devices. The height of the upper surface of the field oxide above the upper surface of the substrate will vary depending upon the desired thickness of the field oxide but will cause fewer step coverage problems for subsequent processing steps.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming a portion of a semiconductor integrated circuit; comprising the steps of:

forming a plurality of active areas in an upper surface of a portion of a body;

forming a thermal field oxide region separating at least two of the plurality of the active areas, wherein an upper surface of the field oxide region is substantially planar with an upper surface of the body; and forming nitride spots extending from an upper surface of the field oxide region into the bulk of the field oxide region and spaced apart from a peripheral edge of the field oxide region to reduce the bird's beak of the field oxide.

2. The method of claim 1, wherein the field oxide has a thickness of between approximately 500–5000 angstroms.

3. A method of forming a portion of a semiconductor integrated circuit; comprising the steps of:

forming a first oxide layer over a portion of a substrate;

forming a first nitride layer over the first oxide layer;

patterning and etching the first oxide and nitride layers to form an opening exposing a portion of the substrate;

etching the substrate in the opening;

forming a second nitride layer over the first nitride layer and in the opening over the exposed substrate;

etching the second nitride layer to form a nitride sidewall spacer along the edge of the first nitride layer and oxide layer and exposed substrate opening;

growing a field oxide region in the opening having an upper surface substantially planar with an upper surface of the substrate; and removing the nitride sidewall above the surface of the field oxide region, leaving a nitride spot extending from an upper surface of the grown field oxide region into the bulk of the grown field oxide region spaced apart from a peripheral edge of the grown field oxide region.

4. The method of claim 3, wherein the substrate is etched to a depth of between approximately 200–5000 angstroms.

5. The method of claim 4, wherein the substrate is etched to a depth of approximately 1000 angstroms.

6. The method of claim 3, wherein the substrate is anisotropically etched.

7. The method of claim 3, further comprising the step of:

oxidizing the substrate before the second nitride layer is formed, to form a second oxide layer in the opening over the horizontal and vertical surfaces of the exposed substrate.

8. The method of claim 7, wherein the second oxide layer has a thickness of between approximately 5–200 angstroms.

9. The method of claim 8, wherein the second oxide layer has a thickness of between approximately 5–30 angstroms.

10. The method of claim 3, wherein the first oxide layer has a thickness of between approximately 5–200 angstroms.

11. The method of claim 10, wherein the first oxide layer has a thickness of approximately 40 angstroms.

12. The method of claim 3, wherein the first and second nitride layers comprise silicon nitride.

13. The method of claim 3, wherein the first nitride layer has a thickness of between approximately 50–1000 angstroms.

14. The method of claim 13, wherein the first nitride layer has a thickness of approximately 400 angstroms.

15. The method of claim 3, wherein the second nitride layer has a thickness of between approximately 20–1000 angstroms.

16. The method of claim 15, wherein the second nitride layer has a thickness of approximately 200 angstroms.

17. The method of claim 3, wherein the second nitride layer is anisotropically etched to form a sidewall along the edge of the opening.

18. The method of claim 3, wherein the first nitride layer is formed by chemical vapor deposition.

19. The method of claim 3, wherein the field oxide is grown to a thickness of between approximately 500–5000 angstroms.

20. The method of claim 3, further comprising the step of:
prior to forming the second nitride layer, forming a second oxide layer in the opening over the exposed substrate.

21. The method of claim 3, further comprising the step of:
implanting oxygen into the substrate in the opening before the second nitride layer is formed.

22. The method of claim 3, further comprising the step of:
implanting oxygen into the substrate in the opening after the nitride sidewall spacer is formed.

23. A method of forming a portion of a semiconductor integrated circuit, comprising the steps of:

forming a first oxide layer over a portion of a substrate;

forming a first nitride layer over the first oxide layer;

patterning and etching the first oxide and nitride layers to form an opening exposing a portion of the substrate;

etching the substrate in the opening;

forming a second nitride layer over the first nitride layer and in the opening over the exposed substrate;

etching the second nitride layer to form a nitride sidewall spacer along the edge of the first nitride layer and oxide layer and exposed substrate in the opening;

growing a field oxide region in the opening and around a portion of the nitride sidewall spacer, the grown field oxide region having an upper surface substantially planar with an upper surface of the substrate; and removing the first nitride layer, the first oxide layer and the nitride sidewall spacer, leaving an opening extending from an upper surface of the grown field oxide region into the bulk of the grown field oxide region where the nitride spacer is removed.

24. The structure of a portion of a semiconductor integrated circuit formed at a surface of a body, comprising:

a plurality of active areas in an upper surface of a portion of the body;

a field oxide region separating at least two of the plurality of the active areas, wherein an upper surface of the field oxide region is substantially planar with an upper surface of the body; and nitride spots extending from an upper surface of the field oxide region spaced apart from a peripheral edge of the field oxide region into the bulk of the field oxide region.

25. The structure of claim 24, wherein the field oxide has a thickness of between approximately 500–5000 angstroms.

* * * * *